United States Patent [19]

Carano et al.

[11] Patent Number: 5,492,595
[45] Date of Patent: Feb. 20, 1996

[54] METHOD FOR TREATING AN OXIDIZED COPPER FILM

[75] Inventors: Michael V. Carano, Youngstown; Therese M. Harryhill, McDonald, both of Ohio

[73] Assignee: Electrochemicals, Inc., Maple Plain, Minn.

[21] Appl. No.: 226,017

[22] Filed: Apr. 11, 1994

[51] Int. Cl.$^6$ .................................. B44C 1/22; C23F 1/00
[52] U.S. Cl. ..................... 216/101; 216/106; 252/79.4; 428/209
[58] Field of Search .......................... 156/629, 630, 156/634, 637, 656, 659.1, 664, 666, 667, 901, 902; 252/79.1, 79.2, 79.4; 148/6.14 R, 6.2; 428/209, 596, 601, 901

[56] References Cited

U.S. PATENT DOCUMENTS

| | | | |
|---|---|---|---|
| 2,364,993 | 12/1944 | Meyer | 148/6 |
| 3,198,672 | 8/1965 | De Hart | 148/86.14 |
| 3,240,662 | 3/1966 | Smyers | 161/225 |
| 3,374,129 | 3/1968 | Boucher | 156/3 |
| 3,481,777 | 12/1969 | Spannhake | 117/212 |
| 3,544,389 | 12/1970 | Vazironi | 148/6.14 |
| 4,409,037 | 10/1983 | Landau | 148/6.14 |
| 4,642,161 | 2/1987 | Akahoshi | 156/630 |
| 4,702,793 | 10/1987 | Garlough et al. | 156/629 |
| 4,902,551 | 2/1990 | Nakaso | 428/137 |
| 4,997,516 | 3/1991 | Adler | 156/630 |
| 4,997,722 | 3/1991 | Adler | 428/596 |
| 5,006,200 | 4/1991 | Chen | 156/629 |
| 5,106,454 | 4/1992 | Allardyce et al. | 156/629 |

OTHER PUBLICATIONS

Danehy et al., "Iodometric Method For The Determination Of Dithionite, Bisulfite, And Thiosulfate In The Presence Of Each Other And Its Use In Following The Decomposition Of Aqueous Solutions Of Sodium Dithionite," Analytical Chem., 46 pp. 391–394 (1974).

*Primary Examiner*—William Powell
*Attorney, Agent, or Firm*—Marshall, O'Toole, Gerstein, Murray & Borun

[57] ABSTRACT

The present invention is directed to an improved method for treating an oxidized surface of a copper film for bonding to a resinous layer such as in the formation of a single-sided, double-sided, or multi-layered circuit board and to a layered product produced by the method. In particular, the method of the present invention comprises the steps of: contacting the oxidized surface of a copper film, having cupric oxide whiskers protruding therefrom, with an acidic reducing solution having a pH of 1 to 6.5 and having an effective amount of a water soluble thiosulfate reducing agent dissolved therein to provide a reduced copper surface; and rinsing the reduced copper surface with an acidic solution to produce a rinsed and reduced copper surface having reduced whiskers protruding therefrom, said reduced whiskers each being a mix of cuprous oxide and metallic copper. Preferably, the reduced surface is treated with a passivating agent to minimize any reoxidation prior to laminate formation.

24 Claims, 3 Drawing Sheets

METHOD FOR TREATING AN OXIDIZED COPPER FILM

BACKGROUND OF THE INVENTION

A. Field of the Invention

The present invention is directed to an improved method and composition for the surface treatment of a copper foil. More particularly, the present invention is directed to a method and composition for reducing an oxide whisker coating on the surface of a copper foil such that the reduced copper surface retains sufficient whisker structure to provide improved adhesion to a resinous surface bonded thereto. The present invention is useful because it is capable of producing single-sided, double-sided, and multi-layer circuit boards that exhibit good thermal and mechanical strength and good acid resistance.

B. Background of the Invention

Copper foil and/or film (hereinafter "copper film") is used in the preparation of single-sided, double-sided, and multi-layer circuit boards. In the preparation of those circuit boards, at least one surface of the copper film is bonded or laminated to a resinous substrate such as an epoxy, a polyamide, or a phenolic which may or may not be reinforced with glass or other fibers. Ideally, the resin should bind to the copper with sufficient strength to prevent separation during subsequent procedures, such as soldering or during the thermal and mechanical stresses imposed by actual use.

However, in reality, it is difficult to achieve good bond strengths between the ordinary smooth surface of a copper film and the corresponding surface of a resin. It was theoretically known that increasing the surface area of the copper film, such as by roughening its surface, is capable of producing greater bond strengths. Several approaches to increasing the surface area of the copper, and thus, the potential bonding strengths to resin, have been disclosed in the prior art. U.S. Pat. No. 2,364,993 first taught the oxidation of a metallic copper surface to a black oxide layer using an alkaline chlorite solution at 200° F. for five minutes. Subsequently U.S. Pat. Nos. 3,177,103, 3,198,672, 3,240, 662, 3,374,129 and 3,481,777 applied this technology to resin-copper bonding in printed circuit boards.

Other methods for providing a copper oxide layer on a copper film include oxidation of the copper surface with hydrogen peroxide, such as disclosed in U.S. Pat. No. 3,434,889, or with alkaline permanganate, such as disclosed in U.S. Pat. No. 3,544,389. The resultant copper oxide layers are layers of copper II (cupric) oxide and are referred to in the an as a "brown oxide" or a "black oxide" layer (collectively herein "a black oxide"). Ideally, the cupric oxide layers are composed of long needles or whiskers (hereinafter "whiskers") of cupric oxide.

A problem with many of the copper oxide layers was that they were too thick and fuzzy to provide good mechanical strength. Another problem was the mixed formation of cuprous oxide near the surface and cupric oxide away from the surface. Subsequent patents, such as U.S. Pat. No. 4,409,037 (Landau) which issued on Oct. 11, 1983, optimized reagent concentrations to produce a brown colored oxide layer that allegedly exhibited peel strengths greater than about 5 pounds per inch. Other methods for producing black oxide layers are disclosed in Rider et al., "Printed and Integrated Circuitry", New York, N.Y., McGraw-Hill 1963 at pp. 24–27.

Although the copper oxide layers greatly increased the surface area of the copper, they still suffered from two additional problems. The first problem, as described in U.S. Pat. No. 4,997,516 (Adler), which issued on Mar. 5, 1991, is that the "[c]opper oxides such as cupric/cuprous oxides are soluble in acid, and serious difficulties may arise as a result of later process steps which involve the use of acid." ['516 patent at col. 3, lns. 5–8.] For example, sulfuric and hydrofluoric acids are frequently used to remove smears and glass fiber fragments respectively in the through holes of circuit boards. Each acid is capable of attacking and dissolving the black copper oxide whiskers at the interface of the resin and copper film to form what is known in the art as a "pink ring". The "pink ring" forms due to the pink color of the copper surface as it appears through the resin after the black (or brown) oxide copper has been dissolved away. Such "pink rings" may extend several millimeters inward away from the hole. In the art, an increasing number and diameter of "pink rings" is associated with decreasing quality and bond strength in a circuit board.

Additional problems associated with using a copper oxide layer include the fact that the copper oxide layer is "brittle", has "poor mechanical properties" and a tendency "to get wet and contaminated easily." [See U.S. Pat. No. 5,506,200 (Chen), which issued on Apr. 9, 1991 at col. 1, lns. 28–30.] Chen's approach to solving these problems was to reduce the copper oxide layer "to cuprous oxide but not metallic copper" ['200 at col. 3, lns. 5–7] at a neutral to alkaline pH (i.e., pH "7–12") [ e.g., '200 at col. 3, ln. 15]. Although Chen's process reduced the radius both of laminate voids from 3–5 mils to less than 1 mil and of "pink rings" from 11–14 mils to 4–6 mils, Chen's process did not completely solve the problem. Accordingly, it is an object of the present invention to provide a surface on a copper film that is suitable for bonding to a resin and that has minimal amounts of the acid susceptible cuprous or cupric oxides thereon.

Adler taught that reducing the copper oxide whiskers to metallic copper with a reducing agent, such as formaldehyde, produced "a mass of copper particles or powder rather than a microstructure of discrete copper whiskers." ['516 at col. 5, lns. 15–16.] According to Adler, the powdery copper surface is objectionable for the following reasons:

The copper powder: (a) significantly reduces peel strength, apparently through loss of the desired reticulated microstructure; (b) is conductive and may cause "shorting"

between conductor lines in the printed circuit made with that copper foil treatment; (c) will be encapsulated in the resinous substrate during lamination; and (d) is difficult or impossible to selectively remove.

['516 (Adler) at col. 5, lns. 49–57.] By way of example, Adler reduced a black oxide surface, having an original peel strength of 6.0 to 6.5 lb/inch, with formaldehyde. The resulting reduced surface had a peel strength of 3 to 4.5 lb/inch. Adler similarly teaches that when a black copper oxide layer was reduced to cuprous oxide with hydrazine and the resulting cuprous oxide layer was dissolved with HCl-NaCl, the surface was powdery and only exhibited a peel strength of 2–3 lb/inch. Likewise, Adler teaches that alkaline sodium hydrosulfite ($Na_2S_2O_4$) reduced a black copper oxide surface to "a powdery copper product" similar to that produced by formaldehyde. However, Adler states that if "gelatin" is added to the alkaline sodium hydrosulfite, the black copper oxide first turns to a "greenish material," which comprises "hydrous cuprous oxide," before becoming fully reduced to powdery copper. ['516 at col. 6, lns. 28–32.] According to Adler, if the reduction process is "interrupted" while the surface is still green, the cuprous hydroxide can be selectively dissolved in a subsequent step with HCl-NaCl to leave behind a non-powdery, copper whisker surface. [See '516 at col. 6, lns. 32, and 40–41.] Adler reports that the resulting non-powdery copper whisker surface had a peel strength of 5.9 lb/inch after lamination. However, this peel strength is less than the "6.0 to 6.5 lb/inch" peel strength reported by Adler for the original black oxide surface.

Accordingly, it is an object of the present invention to provide a method for bonding a copper film to a resin that provides good mechanical and thermal strength but that substantially eliminates the "pink ring" phenomenon and that eliminates the brittleness and the poor mechanical properties associated with bonding to a copper oxide layer.

It is another object of the present invention to provide a method that produces a surface on a copper film that has a good peel strength at least as good as the conventional black oxide surface.

It is a further object of the present invention that the method not require the presence of protein (gelatin) or polymeric moderating agents.

SUMMARY OF THE INVENTION

It was unexpectedly discovered that a layer of cupric oxide whiskers on a copper film is convertible in a two step reaction in the absence of a polymeric material to a layer of reduced copper whiskers that have sufficient structure and strength to impregnate and bind to the surface of a resin to produce a foil resin laminate that has both good thermal and mechanical strength and that has minimal susceptibility to the "pink ring" phenomenon.

In particular, the present invention is directed to a method for treating an oxidized surface of a copper film in preparation for binding to a resinous layer. The method of the present invention comprises the steps of:

contacting an oxidized surface of a copper film, having cupric oxide whiskers of a predetermined size protruding therefrom, with an acidic reducing solution having a pH of 1 to 6.5 and having an effective amount of a water soluble thiosulfate reducing agent dissolved therein to provide a reduced copper surface; and rinsing the reduced copper surface with an acidic solution to produce a rinsed and reduced copper surface having reduced whiskers of less than said predetermined size protruding therefrom, said reduced whiskers each being a mix of cuprous oxide and metallic copper.

In the above method, a preferred pH is 3 to 5.5; a preferred water soluble thiosulfate reducing agent is sodium thiosulfate.

It is also within the scope of the present invention that the reduced surface of the copper be treated with a passivating agent.

It is also within the scope of the invention to add one or more surfactants to the acidic reducing solution to facilitate the oxide reduction and any oxide dissolution.

DETAILED DESCRIPTION OF THE INVENTION

The present invention is directed to a process for treating the oxide whiskers on the oxidized surface of a copper film or foil (hereinafter "film") that results in enhanced bonding between the copper film and a resin layer and that substantially eliminates the "pink ring" phenomenon in both single-sided or multi-layer circuit boards produced therefrom.

More particularly, the present invention is directed to a process for reducing the cupric oxide whiskers on the oxidized surface of a copper film to produce a reduced copper surface having reduced copper whiskers thereon in sufficient numbers, size and a shape to be capable of impregnating a resin surface and providing enhanced bonding of the copper surface to the corresponding surface of the resin layer.

Thus, in one aspect, the present invention is directed to a process for treating a black oxide layer on the surface of a copper film, the method comprising the steps of:

contracting the oxidized surface of a copper film, having cupric oxide whiskers of a predetermined size protruding therefrom, with an acidic reducing solution having a pH of 1 to 6.5 and having an effective amount of a water soluble thiosulfate reducing agent dissolved therein to provide a reduced copper surface; and rinsing the reduced copper surface with an acidic solution to produce a rinsed and reduced copper surface having reduced whiskers of less than said predetermined size protruding therefrom, said reduced whiskers each being a mix of cuprous oxide and metallic copper.

The present invention is directed to a method for treating the black oxide whiskers of an oxide layer on copper film. The preparation of a black oxide layer on a copper film is well known in the art. The oxide layer is typically prepared by subjecting a copper film to an oxidizing solution, such as an alkaline chlorite solution, a hydrogen peroxide solution, or an alkaline permanganate solution. In particular, U.S. Pat. No. 3,198,672, which issued on Aug. 3, 1965, and U.S. Pat. No. 3,374,129, which issued on Mar. 19 1968, each teach forming cupric oxide needles on a copper film using an alkaline chlorite and are hereby incorporated herein by reference. U.S. Pat. No. 3,544,389, which issued on Dec. 1, 1970, teaches the oxidation of a copper film to cupric oxide using permanganate and is incorporated herein by reference.

A typical oxidizing solution is an aqueous alkaline solution, preferably pH 8 or greater, of an oxidizing agent such as sodium chlorite or potassium persulfate. Typical concentrations for the oxidizing agents would be in the range of 2 to 200 grams per liter. An alkaline pH is obtained by dissolving from 1 to 50 grams per liter of sodium hydroxide. The copper film is immersed in the oxidizing solution for one to ten minutes at approximately 130° to 200° F. The cupric oxide crystals are of the predetermined size when the oxide crystal growth on the copper film is in the range of 0.3 to 0.7 mg/cm$^2$ as determined by weight gain, preferably, 0.4 to 0.6 mg/cm$^2$. A preferred oxidation reagent is commercially available from Electrochemicals, Inc., Youngstown, Ohio as Copper Treatment Process No. 501.

Typically, the oxidation step is followed by a water rinse and optional air drying or drying at elevated temperatures in the range of 220° to 320° F. Those of ordinary skill in the art recognize that rinsing and drying steps are used to prevent the contamination and dilution of subsequent reagent baths.

Figure 1:
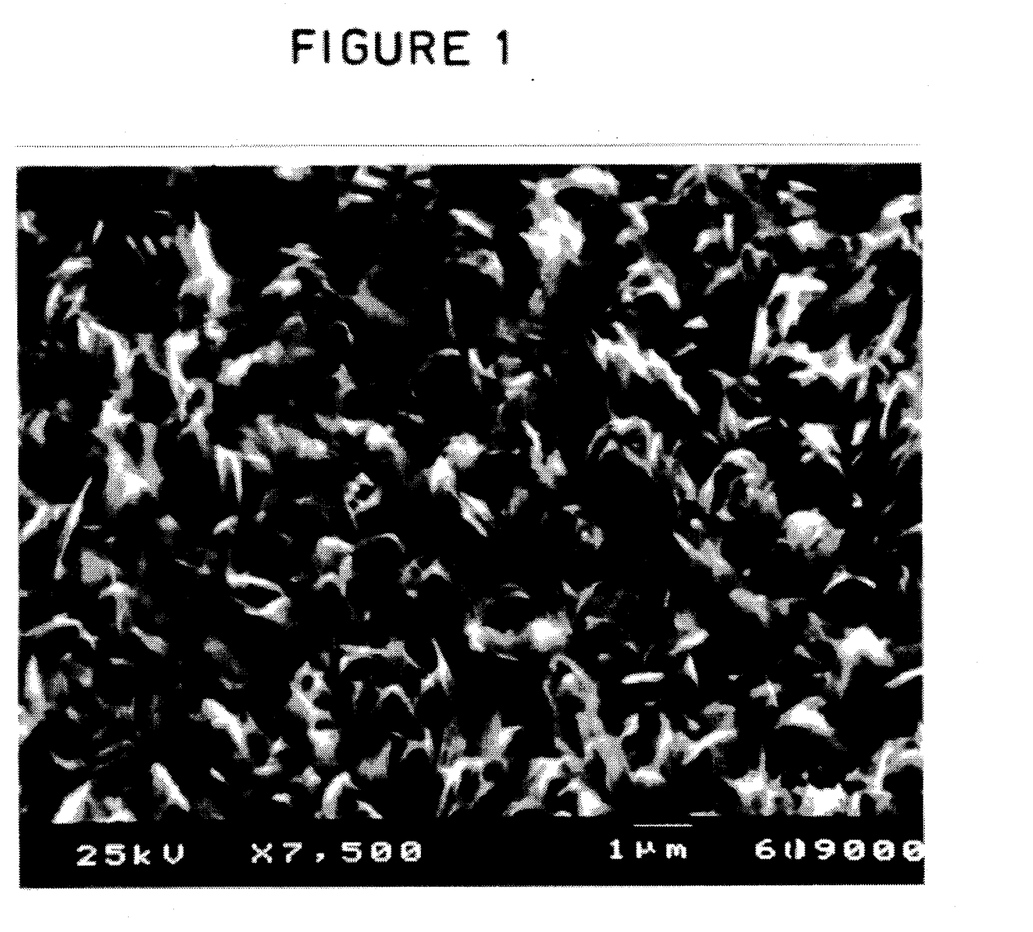
FIG. 1 is a photograph of an oxidized surface of a copper film taken by a scanning electron microscope (SEM) at a 7,500 magnification, i.e., "7,500x."

When the resulting oxidized surface of the copper film is viewed under the scanning electron microscope (SEM) at 7,500x (FIG. 1 ), it exhibits a plurality of fine jagged (black oxide) needles between about 1–2 μm (microns) in length. As shown in FIG. 1, the fine jagged structure of the oxide layer is capable of impregnating a resin layer under heat and pressure and binding to it as taught in the prior art. However, the length of the needles and their brittleness precludes the resin surface from completely filling all of the valleys between the needle peaks even when heat and pressure are applied. As a result, when a laminate so formed is subjected to treatment with an acid during normal etching or desmearing, the acid is able to infiltrate the resin free valleys and dissolve the acid soluble black copper oxide in its wake, leaving the pink color of the metallic copper behind. When such dissolution occurs around a through hole, the result is a "pink ring" encircling the through hole. The diameter of the "pink ring" reflects the degree of acid penetration between the copper and the resin layers of the copper-resin laminate.

Figure 2:
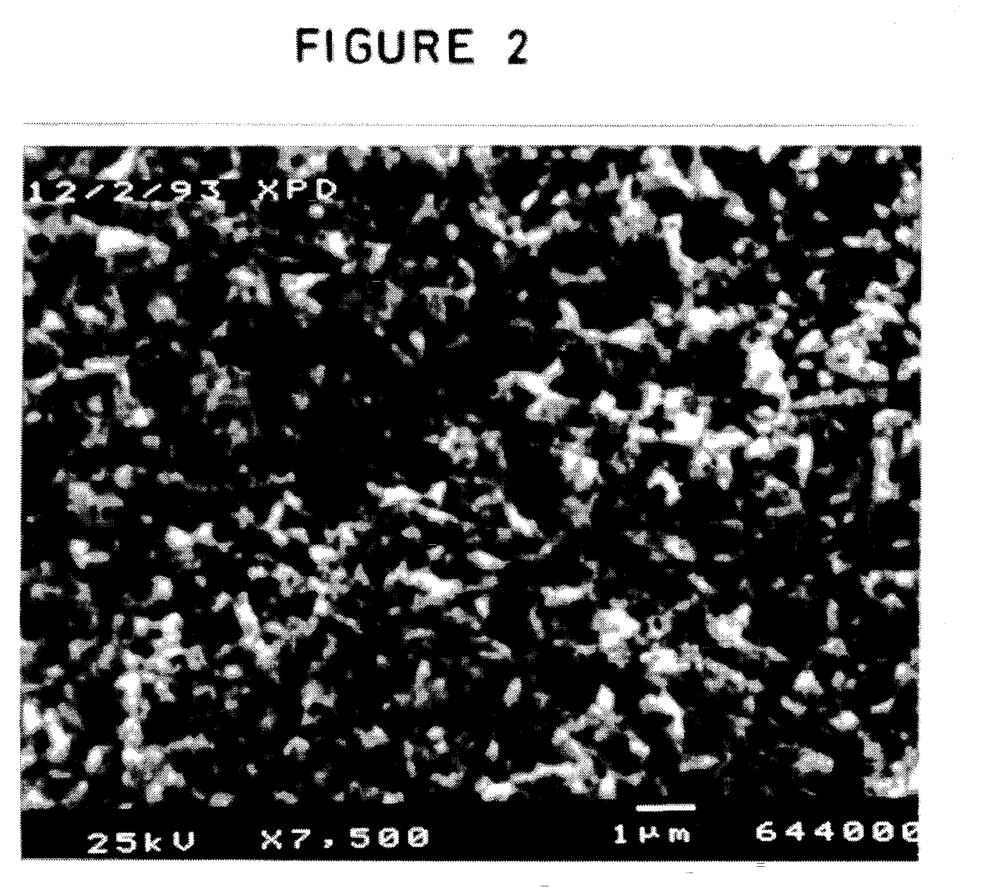
FIG. 2 is a photograph taken by a scanning electron microscope at 7,500x of an oxidized surface of a copper film (such as shown in FIG. 1) after the latter was contacted with an acid reducing solution according to the process of the present invention.

The method of the present invention comprises contacting the above described oxidized surface of a copper film, such as shown in FIG. 1 and having whiskers of a predetermined size protruding therefrom, with an acidic reducing solution having both a pH of 1 to 6.5 and an effective amount of a water soluble thiosulfate reducing agent dissolved therein to produce a reduced copper surface having reduced whiskers of less than the predetermined size, such as shown in FIG. 2, protruding therefrom (hereinafter "the reducing step"). The acidic reducing solution is typically an aqueous solution. However, it is also within the scope of the present invention that the aqueous solution also contains up to 10% by volume of one or more water soluble alcohols, such as methanol, ethanol or isopropanol, alone or in combination with one or more water soluble organic solvents, such as tetrahydrofuran, and dimethylformamide.

The water soluble thiosulfate reducing agent is typically an alkali metal thiosulfate salt such as sodium thiosulfate, potassium thiosulfate or lithium thiosulfate. Regardless of the water soluble thiosulfate salt chosen, it is always present in the acidic reducing solution in an amount that is effective in combination with the acidic solution to produce a reduced copper surface such as objectively manifested by the shortening of the long cupric oxide whiskers. Compare FIGS. 1 and 2. Typically, the amount of water soluble thiosulfate that is dissolved in the acidic reducing solution is 1–100 g/l, more typically, it is 5–25 g/l.

The pH of the acidic reducing solution is from 1 to 6.5, preferably pH 3 to 5.5. To maintain the pH of the reducing solution within the range of 1 to 6.5 or preferably 3 to 5.5, one adds an effective amount of acidic buffering compound to the reducing solution. Suitable buffering compounds include the sodium, potassium and lithium salts of bisulfites and bisulfates. Preferred buffering compounds are the bisulfites. An especially preferred bisulfite is sodium bisulfite. Acetate was determined to be unsuitable for use in buffering the acidic reducing solution.

Although the reducing step is capable of being run when the acidic reducing solution is at room temperature (68° F.), it is typically run when the reducing solution has a temperature from about 80° F. to about 200° F. More preferably, the reducing solution has a temperature from about 100 ° F. to about 110° F. The oxidized surface of the copper film is typically treated with the reducing solution from about 0.5 to about 6 minutes when the temperature of the reducing solution is from 100° F. to 110° F. For any given concentration of thiosulfate reducing agent, an increase in the temperature of the reducing solution decreases the reducing time.

Although not necessary to the practice of the present invention, it is also within the scope of the present invention that the acidic reducing solution contain one or more neutral or cationic surfactants. The surfactants should be water soluble, stable, and non-foaming. Acceptable cationic surfactants include cetyl dimethyl benzyl ammonium chloride such as AM-MONYX T (Onyx Chemical Corporation); an ethanolated alkylguanidine amine complex such as AEROSOL C-61 (American Cyanamid); lipocals; dodecyldiphenyl oxide disulfonic acid (DDODA) such as DOWFAX 2A1 (Dow Chemical); a sodium salt of DDODA such as STRODEX (Dexter Chemical Corporation); and salts of complex organic phosphate esters. Suitable nonionic surfactants include ethoxylated nonyl phenols, such as POLY-TERGENT® B Series (Olin Corporation), alkoxylated linear alcohols, such as POLY-TERGENT® SL-Series (Olin Corporation); and polyoxyethylene ethers such as TRITON (Union Carbide Chemicals and Plastics, Inc.). Preferred surfactants are TRITON X114 and TRITON X165, particularly when used in combination.

In the reducing step, the copper film with the oxidized surface is contacted with the acidic reducing solution, typically by spraying or by dipping. Regardless of the method of contact between the oxide surface and the acidic reducing solution, the oxide surface is contacted for a sufficient time to convert the brittle and needle-like oxide whiskers, such as shown in FIG. 1, into a stubbier reduced whisker such as shown in FIG. 2.

The composition of the copper surface after the reducing step was determined by Electron Spectroscopy for Chemical Analysis (ESCA). ESCA is a surface analysis technique wherein a focused beam of monochromatic aluminum x-rays is used to irradiate an area of the sample in an ultra-high vacuum chamber in order to excite atoms within the sample. The excited atoms release photoelectrons whose energies are determined by the difference between the incident x-ray energy and the binding energy of that electron. As the energy of the photoelectron is measured by this technique, the binding energy of the electron can be accurately determined. This binding energy is characteristic of the element from which the photoelectron was emitted and the chemical environment of this "parent" atom. Because these photoelectrons have relatively low energy, they can only escape from the sample if generated very close to the surface (10–100 Angstroms). Therefore, this technique is very useful for characterizing thin surface layers of vacuum stable materials.

Using ESCA, the composition of the reduced surface was determined at the very surface (A/R) and at surface depths of 100, 200, and 400 Angstroms (A). See Tables I–V. The various surface depths were generated by equipping the ESCA instrument with a calibrated argon gun calibrated to etch at a particular rate. Tables I and II report the relative composition in weight percent of the oxidized surface of a copper film after 5 minute dips in acidic (pH 4.4) reducing solutions (temp.=110° F.) having 10 g/l and 25 g/l respectively of sodium thiosulfate dissolved therein. The results are reported in terms of cupric oxide (CuO), cuprous oxide ($Cu_2O$) and metallic copper (Cu Metal).

TABLE I

| Surface Depth | CuO | $Cu_2O$ | Cu Metal |
| --- | --- | --- | --- |
| A/R | 100 | — | — |
| 100 Å | 9.1 | 90.9 | — |
| 200 Å | — | 82 | 18 |
| 400 Å | — | 71 | 29 |

TABLE II

| Surface Depth | CuO | $Cu_2O$ | Cu Metal |
| --- | --- | --- | --- |
| A/R | 28 | 72 | — |
| 100 Å | — | 66 | 34 |
| 200 Å | — | 52 | 48 |
| 400 Å | — | 52 | 48 |

Comparing Tables I and II, it is apparent that the 25 g/l of the thiosulfate reducing agent used to produce the dam in Table II versus the 10 g/l used for Table I, resulted in a more effective reduction of the cupric oxide layer on the surface with only 28% CuO being reported in Table II versus 100% CuO in Table I. In addition, with the lower concentration of thiosulfate reducing agent, the surface composition at a depth of 100 Angstroms still reflected the presence of cupric oxide, i.e., cuprous oxide (90%), cupric oxide (9.1%), and no metallic copper. See Table I. In contrast, in Table II, the surface composition at a depth of 100 Angstroms reflects 0% cupric oxide and instead 34% metallic copper.

Another step in the process of the present invention is the acid rinsing step. In the acid rinsing step, the reduced surface is subjected to rinsing in an acidic solution that is capable of removing any cupric oxide remaining thereon to produce a reduced surface having whiskers of less than the predetermined size protruding therefrom. The resulting whiskers are a mixture of cuprous oxide and metallic copper. The reduced and acid rinsed whiskers are also stubbier and less brittle than the cupric oxide whiskers that they replace.

Although the stubbier whiskers produced by the present process penetrate the resin layer less deeply during laminate formation than would the original cupric oxide whiskers, they penetrate sufficiently deep to form a strong bond between the copper and the resin. Further, the stubby whiskers are less brittle than the cupric oxide whiskers that they replace and thus, are more resistant to breaking during mechanical and thermal stresses. The stubbier whiskers also facilitate a closer bonding between the metallic copper surface and the resin layer by allowing the resin layer to be pressed into the shallower valleys between the stubbier whiskers. As a result, the conventional acid solutions are substantially precluded from penetrating between the resin and copper layer of the laminate. Also, because there is no cupric oxide layer that is capable of dissolution during the conventional acidic desmearing and etching steps, there is substantially no formation of "pink ring" around the through holes.

Figure 3:
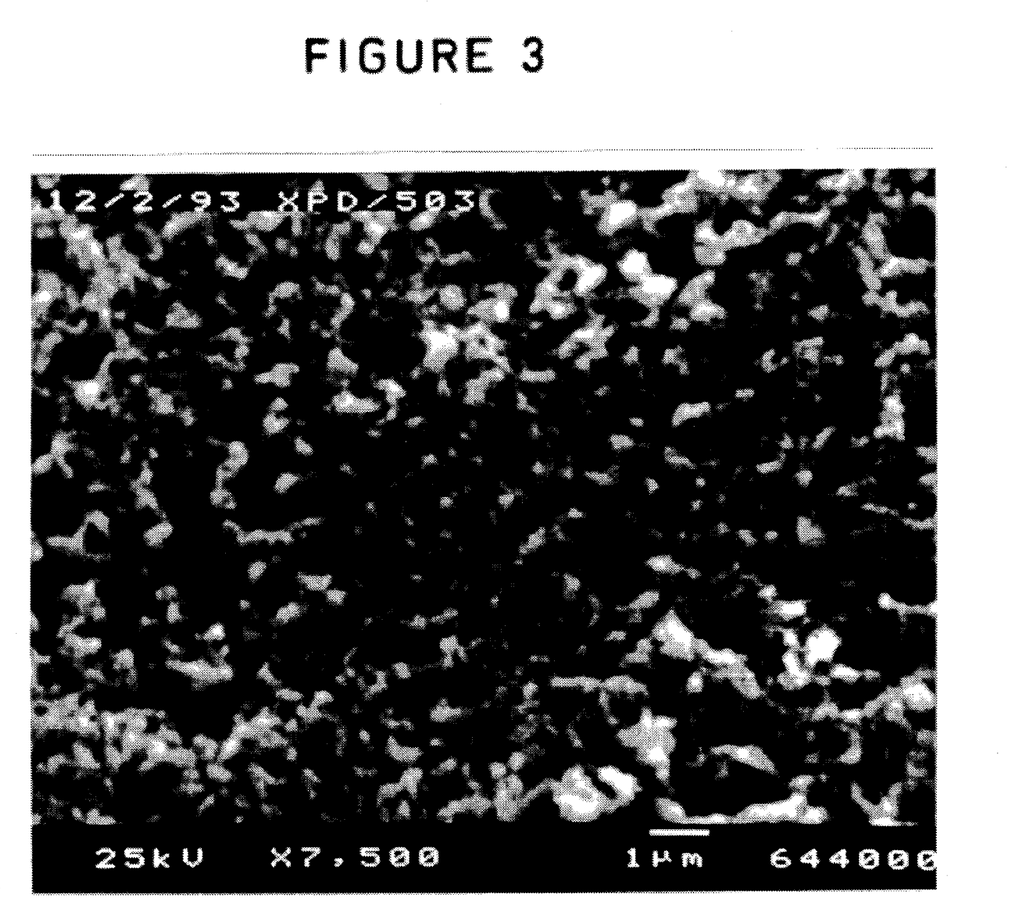
FIG. 3 is a photograph taken by a scanning electron microscope at 7,500x of copper surface that was first oxidized (as shown in FIG. 1), then reduced according to the method of the present invention (as shown in FIG. 2), and finally subjected to an oxide dissolving acid rinse for about one minute.

The structure of the stubby cuprous oxide/metallic copper whiskers that are produced by the method of the present invention are shown in FIG. 3. FIG. 3 is a photograph taken by a scanning election microscope at 7,500x of an oxidized copper surface, as shown in FIG. 1, after the steps of reducing to produce the whiskers as shown in FIG. 2, and rinsing in an acidic solution of about 0.3 to 1.0N $H_2SO_4$ for about one minute. A visual comparison of FIGS. 2 and 3 reflects that acid rinsing produced little apparent difference in the size or structure of the reduced whiskers.

However, as reported in Table III, the composition of the whiskers after acid rinsing is different. In particular, the surface composition (Table III) of the reduced and acid rinsed surface reflects that the whiskers protruding therefrom are now free of cupric oxide and are instead a mixture of metallic copper and cuprous oxide. (See Table III which is an ESCA analysis of an oxidized copper film after the steps of reducing with an acidic thiosulfate (25 g/l) solution and acid rinsing with a 0.75N solution of sulfuric acid having a phosphate ester wetting agent dissolved therein.)

TABLE III

| Surface Depth | CuO | $Cu_2O$ | Cu Metal |
| --- | --- | --- | --- |
| A/R | — | 47 | 53 |
| 100 Å | — | 15 | 85 |
| 200 Å | — | 6.7 | 93.3 |
| 400 Å | — | 8.1 | 91.9 |

The effectiveness of the acid rinsing step in the process of the present invention is seen by substituting an alkaline rinse in its place. In particular, when a reduced copper surface, such as analyzed in Table II, was rinsed with an alkaline solution (0.2N NaOH and 20 mg/l of 2-mercaptobenzothiazole) instead of an acidic solution as reported in Table III, the reduced copper surface was reoxidized as reported in Table IV. Thus, whereas the acid rinse of the present invention reduced the surface (A/R) cupric oxide from 28% (Table II) to 0% (Table III), the alkaline rinse increased it to 100% (Table IV). Likewise, whereas the reduced surface (Table II) and the acid rinsed surface (Table III) both had 0% cupric oxide at a surface depth of 100 Angstroms, the alkaline rinse produced 5.4% (Table IV) cupric oxide at 100 Angstroms.

TABLE IV

| Surface Depth | CuO | $Cu_2O$ | Cu Metal |
| --- | --- | --- | --- |
| A/R | 100 | — | — |
| 100 Å | 5.4 | 64.3 | 30.3 |
| 200 Å | — | 72 | 28 |
| 400 Å | — | 56 | 44 |

It is also within the scope of the present invention that the reduced copper surface be treated with a passivating solution having an organic or an inorganic passivating agent dissolved therein. The treatment with the passivating solution is performed after the acid rinsing step. Preferably, it is performed before drying, particularly before drying the reduced copper surface with heat.

Passivating involves immersing the reduced copper film in a solution containing an effective amount of one or more passivating agents. Suitable passivating agents include hydroquinone, resorcinol, benzotriazole, sodium tolyltriazole, coco imidazoline, 2-ethylhexyl mercaptoacetate, chromate, 2-mercaptobenzothiazole or a sodium, potassium, lithium or ammonium salt thereof.

Regardless of the passivating agent, the passivating solution contains an effective amount of a passivating agent dissolved therein. To determine an effective amount, one skilled in the art would dissolve increasing amounts of a subject passivating agent in water until the desired passivating effect was achieved. Typically, the effective concentration of the passivating agent is in the range of about 0.1 g/l to saturation. Preferably the amount of the passivating agent dissolved in the passivating solution is at the lower end of the effective range.

A preferred passivating agent is 2-mercaptobenzothiazole or a sodium, potassium, lithium or ammonium salt thereof. The compound 2-mercaptobenzothiazole and its sodium salt are commercially available from Pfaltz and Bauer, Waterbury, Conn. and PMC Specialties, Cincinnati, Ohio, respectively.

The solvent for the passivating solution is either water, a water soluble non-aqueous solvent or a combination thereof. By the term "water soluble non-aqueous solvent" as used herein is meant any organic solvent that is substantially miscible with water. Preferred water soluble non-aqueous solvents include one or more members of the group consisting of $C_1$ to $C_6$ alcohols, $C_1$ to $C_6$ glycols, cellosolve (ethylene glycol monoethyl ether), or polyethylene glycols of molecular weight 800 or less, and the like. Such solutions are maintained at an alkaline pH by the addition of sodium or potassium hydroxide, preferably sodium hydroxide, at a concentration of 1.5 g/l for a solution containing 0.2 g/l of 2-mercaptobenzothiazole. Increasing amounts of 2-mercaptobenzothiazole may require the addition of further hydroxide to effect dissolution.

A typical passivating treatment consists of immersing the reduced copper film in the passivating solution at a temperature in the range of 65° to 80° F. for a period of from 1 to 30 minutes. The passivating step is best produced within one hour after the reducing step. Increasing amounts of time between the reducing step and the passivating step permit the reduced copper surface to slowly re-oxidize due to exposure to atmospheric oxygen. However, this oxidation is relatively small compared to the surface oxidation that occurs when a reduced copper film that has not been passivated is baked (dried) prior to bonding to a polymeric resin (i.e., a dielectric).

One effect of the passivating rinse is seen in the ESCA analysis reported in Table V. Table V reports the surface composition of an oxidized, reduced, and acid rinsed copper surface, such as analyzed in Table III, after it was further dipped for 2 minutes in an alkaline solution, 0.2N NaOH, that contained 20 mg/l of mercaptobenzothiazole as the passivating agent. A comparison between Tables III and V reflect that when the passivating rinse is performed after the acid rinse, the surface cuprous oxide decreased slightly from 47% (Table III) to 37% (Table V) by weight, whereas the amount of copper metal correspondingly increased from 53% (Table III) to 63% (Table V).

TABLE V

| Surface Depth | CuO | $Cu_2O$ | Cu Metal |
| --- | --- | --- | --- |
| A/R | — | 37 | 63 |
| 100 Å | — | 7 | 93 |
| 200 Å | — | 5 | 95 |
| 400 Å | — | 4 | 96 |

The process of the present invention produces reduced copper surfaces that are capable of providing a good bond with the corresponding surface of a resin layer as reflected by their resultant peel strengths. Table VI compares the peel strengths of a copper-resin laminates produced by bonding a pair of resin layers (i.e., #2116 which is commercially available from Polyclad, Inc., Nashua, N.H.) to opposing sides of two ounce copper foils that were only oxidized (the Control) versus copper foils that were oxidized and also subjected to one or more steps of the present process. As Table VI reflects, each of oxidized foils 1–7 were subjected to the reducing step of the present invention which consisted of dipping an oxidized copper foil in an acidic reducing solution composed of 25 g/l $Na_2S_2O_3$ and 25 g/l $NaHSO_3$ at 125° F. for the recited time. Foils 4, 6 and 7 were further subjected to the acid washing step of Example 4. Foils 6 and 7 were further subjected to the passivating step of the referenced Examples prior to being bonded to the two resin layers. Foil 4 was bonded to the resin layers without passivating.

As Table VI reflects, the peel strengths increased by approximately 1.5 to 2 pounds/inch (lbs/in) for foils 1–3 as the reduction time increased from three minutes to ten minutes. Table VI also indicates that all oxidized copper foils that were processed by the present invention were capable of producing copper-resin laminates having peel strengths greater than 5 lbs/in. More particularly, the peel strengths of laminates that were produced from oxidized copper foils that were processed according to the process of the present invention ranged from comparable (No. 4) to better than (No. 6–7) the peel strength of the Control (oxide only) both before and after the solder shock test. Thus, the

TABLE VI

| | PEEL STRENGTHS | | | | | |
| --- | --- | --- | --- | --- | --- | --- |
| | Oxide | Acid Reducing | Add Rinse Of | Passivating Step | PEEL STRENGTH lbs/inch | |
| | Weight Gain ($mg/cm^2$) | Step (Minutes) | Example 4 Herein | of Example __ Herein | Before Solder Shock | After Solder Shock |
| Control | 0.40 | — | — | — | 5.17 | 5.21 |
| 1 | 0.40 | 3.0 | — | — | 4.04 | 4.54 |
| 2 | 0.40 | 5.0 | — | — | 6.15 | 6.79 |
| 3 | 0.40 | 10.0 | — | — | 6.52 | 6.38 |
| 4 | 0.40 | 3.0 | Yes | — | 5.02 | 5.08 |
| 5 | 0.40 | 3.0 | — | 5c | 6.32 | 6.02 |
| 6 | 0.40 | 3.0 | Yes | 5a | 5.34 | 5.70 |
| 7 | 0.40 | 3.0 | Yes | 5c | 6.48 | 6.50 | process of the present invention was capable of converting an oxidized copper surface into a copper surface that provided good peel strengths and thermal stability when bonded to a resin layer.

Of the oxidized copper films that were treated by the process of the present invention, the best peel strength was observed for oxidized copper foil 7 of Table VI. Similarly, the best acid resistance and tape transfer results were reported for oxidized copper foils (films) that were processed substantially as foil 7 of Table VI. The supporting data is reported in Example 6 herein.

The oxidized copper films that were reduced, acid rinsed, and passivated by the process of the present invention were tested for their color and uniformity, their acid resistance and their tape transfer. The underlying data for the above tests are reported in the experimental section herein.

The function of the color and uniformity testing is to determine acceptability through visual quality control.

The function of the acid resistance test was to quantitate the acid resistance of the processed copper films by dissolving the remaining acid soluble cupric oxide and cuprous oxide, if any, on the processed copper films. In the acid resistance test, the copper films produced by the process of the present invention were first weighed and then dipped for ten minutes in 17.5% HCl. Thereafter, the copper films were removed, rinsed, dried and re-weighed. Their respective weight losses in mg/cm$^2$ were then calculated. A weight loss of 0.2 mg/cm$^2$ or less for the copper films was considered acceptable.

The function of the tape transfer test was to determine the ability of a processed copper surface to securely bond to a resin layer by determining the amount of loosely adhered material on the surface. Just as paint cannot stick to a dirty or dusty surface, a resin cannot form a strong bond with a surface of a copper film that is layered with loosely adhered materials. In the tape transfer test, a piece of transparent tape (e.g., 3M Brand) was first placed across the dried surface of a processed copper film and then peeled back. The surface of the tape was then visually inspected for materials adhering thereto. The tapes were graded from 1 to 10 with a grade of 10 being the best and reflecting no transferred materials.

The colors of the panels varied. However, the best color and uniformity were produced with acid rinses of 0.1N and 0.2N HCl. All of the copper films produced by the process passed the acid resistance test (10 minutes in 17.5% HCl) with weight losses of less than 0.2 mg/cm$^2$ (typically 0.1 to 0.2 mg/cm$^2$) considered acceptable. The lowest weight losses and thus, the best acid resistance occurred in those copper films wherein the acid rinse did not contain sodium chloride. Surprisingly, the best tape transfer results also occurred on those copper films that were acid rinsed in HCl solutions that did not also contain sodium chloride. See Experimental Section No. 6.

Although not critical to the present invention, those skilled in the art would recognize that longer reagent life is achieved by rinsing and optionally drying the copper films between substantive processing steps. The rinsing step is capable of being performed by any method. Typically, rinsing is accomplished by spraying or dipping, more preferably, by spraying. Drying may be accomplished either actively by using heat and/or air, or passively such as by allowing the rinse solution to evaporate. In either instance, the result is a dry reduced copper surface having stubby whiskers thereon that are capable of bonding to a resin layer by the application of heat and pressure to form a copper resin laminate that exhibits good mechanical and thermal strength, good resistance to attack from acidic pre-plate and plating solutions, and substantially no "pink ring."

When the present invention is placed in the context of one embodiment of an overall process of preparing a copper film-resin laminate that is both acid resistant and that has good mechanical and thermal strength, the process of the present invention is represented by substantive process steps C, E, and G below:

| A | Oxidation of the copper foil (501 Process) | |
|---|---|---|
| B | Water rinse, 2 stage | 3–4 minutes |
| C | Reduction of the Oxide Whiskers | 0.5–8 minutes |
| D | Water Rinse, 2 stage | 2–3 minutes |
| E | Acid Rinse | 0.5–2 minutes |
| F | Water Rinse, 2 stage | 2–3 minutes |
| G | Passivating Rinse | 1–30 minutes |
| H | Water Rinse, 2 stage | 2–3 minutes |
| I | Deionized Water Rinse | 2–3 minutes |
| J | Drying (220°–320° F.) | 5–10 minutes |
| K | Bonding The Copper Resulting Foil to A Resin (heat and pressure) | |

In light of the above, the process of the present invention is particularly useful in a process for preparing single-sided, double-sided and multi-layer circuit boards. To prepare a single-sided circuit board, one whiskered surface of a copper film is bonded to the corresponding surface of a resinous dielectric layer, typically by applying heat and pressure. To prepare a double-sided circuit board, two copper layers each have their respective whiskered surfaces bonded to a separate and opposing surface on one resinous dielectric layer. To prepare a multi-layered circuit board, alternating layers of copper film and dielectric resin layers are bonded to one another. In both the double-sided and multi-layered circuit boards, the separated copper layers are interconnected to one another through a plurality of through holes that have been copper plated.

EXPERIMENTAL SECTION

1. Preparation Of Oxidized Copper Films

A plurality of commercially available copper films (3"×3") were oxidized according to the Copper Treatment Process 501 of Electrochemicals, Inc., Youngstown, Ohio which utilizes sodium chlorite as the oxidizing agent. The resulting oxide crystal growth on each copper film was in the range of 0.38–0.45 mg/cm$^2$ as determined by their respective weight gains.

2. Preparation Of An Acidic Reducing Solution

An acidic reducing solution that was capable of reducing the oxidized copper films according to the process of the present invention was prepared according to the following formulation:

| 10 g/l | $Na_2S_2O_3$ |
|---|---|
| 10 g/l | $NaHSO_3$ |
| 0.2 ml/l | TRITON X-114 |
| 0.2 ml/l | TRITON X-165 |

3. Reducing Oxidized Copper Films

The plurality of oxidized copper films from Example 1 were reduced by being dipped into the acidic reducing solution of Example 2 at about 105° F. for about five minutes, while the solution was mildly agitated.

4. Acid Rinsing The Reduced Copper Films

An acid rinse for use in the process of the present invention was prepared according to the following formula based upon a 1 liter volume:

20 ml/l sulfuric acid 0.05 ml/l TRITON X-114

0.05 ml/l TRITON X-165 balance water.

5. Passivating Rinses For The Reduced And Acid Rinsed Copper Films
   a. Benzotriazole Passivating Rinse
   Based upon a one liter volume, a passivating rinse was prepared according to the following formula:
   0.9 g/l benzotriazole
   2.5 ml/l cellosolve
   balance water.
   b. Benzotriazole/Tolyltriazole Passivating Rinse
   Based upon a one liter volume, a passivating rinse was prepared according to the following formula:
   0.192 g/l benzotriazole
   0.048 g/l tolyltriazole
   2.15 ml/l ethylene glycol
   balance water.
   c. Sodium Mercaptobenzothiazole
   Based upon a one liter volume, a passivating rinse was prepared according to the following formula:
   0.1 g/l sodium mercaptobenzothiazole
   4 g/l of a 50% w/w sodium mercaptobenzothiazole solution having 0.5% w/w NaOH therein
   balance water.
6. Analyses of Treated Copper Films For Color And Uniformity, And Resistance And Tape Transfer The oxide coated copper films that were reduced according to the process of Example 3 above were rinsed and divided into four groups: Groups I, II, III and IV, respectively. Each of Groups I–III were subjected to the same acid rinse step. However, each of Groups I–III was passivated with a different passivating agent as described below. In Group IV, four different concentrations of hydrochloric acid rinse were tested, each containing 50 g/l NaCl.

The processing steps for the reduced copper films in each of Groups I–IV are summarized below:

| Group I: | Acid rinsing with the solution of Example 4(a) for 1 minute<br>↓<br>Passivating with the solution of Example 5(a) for one minute<br>↓<br>Aqueous rinse for one minute<br>↓<br>Dry |
|---|---|
| Group II: | Acid rinsing with the solution of Example 4(a) for 1 minute<br>↓<br>Passivating with the solution of Example 5(b) for one minute<br>↓<br>Aqueous rinse for one minute<br>↓<br>Dry |
| Group III: | Acid rinsing with the solution of Example 4(a) for 1 minute<br>↓<br>Aqueous rinse for one minute<br>↓<br>Passivating with the solution of Example 5(c) for one minute<br>↓<br>Aqueous rinse for one minute<br>↓<br>Dry |
| Group IV: | Acid Rinse for one minute at room temperature with:<br>(a) 8 ml of 0.1 N HCl/0.85 N NaCl; or<br>(b) 8 ml of 0.2 N HCl/0.85 N NaCl; or<br>(c) 8 ml of 0.3 N HCl/0.85 N NaCl; or<br>(d) 16 ml of 0.5 N HCl/0.85 N NaCl. |
| | ↓<br>Aqueous rinse for 1 minute<br>↓<br>Passivating rinse with the solution of Example 5(c) for one minute<br>↓<br>Aqueous rinse for 1 minute<br>↓<br>Dry |

The processed films from each of Groups I–IV were divided into two equal groups ("no-bake" and "bake") with the "bake" half receiving a 220° F. bake for one hour. The "no-bake" and "bake" copper films from each group were evaluated for the following:
1) Color and uniformity;
2) Acid resistance; and
3) Tape transfer.

Results

A. Color and Uniformity

The resulting copper films were manually observed for color and uniformity and the results recorded.

| Group | | |
|---|---|---|
| Group I | no-bake - | brown color, not very uniform per film or when comparing film A vs. film B for example. |
| | bake - | same as no-bake, but slightly darker; some yellowing around the edges. |
| Group II | no-bake - | brown with red tint; some yellowing along outer edges not very uniform. |
| | bake - | slightly darker version of no-bake. |
| Group III | no-bake - | brown with slight yellowing over entire film; worse on some films than others although they were processed together. |
| | bake - | same as no-bake. |
| Group IV | a) 0.1 N no-bake - | colored varied film to film from brown to dark brown; fairly uniform per film. |
| | bake - | dark brown color, variance in film to film uniformity. |
| | b) 0.2 N no-bake - | both no-bake and bake were identical to 0.1 N results. |
| | bake - | same as 0.2 N no-bake. |
| | c) 0.3 N no-bake - | brown and fairly uniform, but yellowing on 10% of film. |
| | bake - | color and uniformity varied film to film, some yellowing. |
| | d) 0.5 N no-bake - | color and uniformity not applicable due to yellowing of 60% of film's surface. |
| | bake - | same as 0.5 N no-bake. |

B. Acid Resistance

To test the acid resistance of the processed films, each copper film was weighed before and after a dip for ten minutes in 17.5% HCl. The difference was then calculated and recorded as weight loss in mg/cm$^2$. A copper film was considered to pass the acid resistance test if the weight loss in mg/cm$^2$ was 0.2 mg/cm$^2$ or less.

| Group | | Weight Loss mg/cm$^2$ | Pass/Fail |
|---|---|---|---|
| I) | no-bake | 0.08 | Pass |
| | bake | 0.10 | Pass |
| II) | no-bake | 0.06 | Pass |
| | bake | 0.10 | Pass |
| III) | no-bake | 0.05 | Pass |
| | bake | 0.06 | Pass |
| IV) | a) no-bake | 0.24 | Pass |

-continued

| Group | | Weight Loss mg/cm² | Pass/Fail |
|---|---|---|---|
| | bake | 0.34 | Fail |
| | b) no-bake | 0.32 | Fail |
| | bake | 0.30 | Fail |
| | c) no-bake | 0.18 | Pass |
| | bake | 0.18 | Pass |
| | D) no-bake | 0.14 | Pass |
| | bake | 0.15 | Pass |

C. Tape Transfer

The copper films from each group were tape transfer tested as described herein and graded from 1 to 10. A grade of 10, which reflects no transfer of material from the film to the tape, is considered the best.

| Group I | no-bake | 7 |
|---|---|---|
| | bake | 9 |
| Group II | no-bake | 8 |
| | bake | 5 |
| Group III | no-bake | 10 |
| | bake | 9 |
| Group IV | a) no-bake | 3 |
| | bake | 2 |
| | b) no-bake | 1 |
| | bake | 1 |
| | c) no-bake | 2 |
| | bake | 2 |
| | d) no-bake | 1 |
| | bake | 1 |

What is claimed is:

1. A method for treating an oxidized surface of a copper film, said method comprising the steps of:
contacting the oxidized surface of a copper film having cupric oxide whiskers protruding therefrom, with an acidic reducing solution having a pH of 1 to 6.5 and having an effective amount of a water soluble thiosulfate reducing agent dissolved therein to provide a reduced copper surface; and
rinsing the reduced copper surface with an acidic solution to produce a rinsed and reduced copper surface having reduced whiskers protruding therefrom, said reduced whiskers each being a mix of cuprous oxide and metallic copper.

2. The method of claim 1, wherein said water soluble thiosulfate reducing agent is a member of the group consisting of sodium thiosulfate, potassium thiosulfate, and lithium thiosulfate.

3. The method of claim 2 wherein said water soluble thiosulfate reducing agent is sodium thiosulfate.

4. The method of claim 2 wherein said acidic reducing solution further comprises sodium bisulfite dissolved therein.

5. The method of claim 4 wherein the temperature of said acidic reducing solution is within the range of 68° F. to 200° F.

6. The method of claim 5 wherein the concentration of sodium thiosulfate in said acidic reducing solution is 1–100 g/l.

7. The method of claim 6 wherein the concentration of sodium thiosulfate in said acidic reducing solution is 5–25 g/l.

8. The method of claim 7 wherein said oxidized surface of a copper film is contacted with said acidic reducing solution for about 0.5 to about minutes.

9. The acid rinsed method of claim 1 or 7 further comprising the step of passivating said reduced copper surface with a solution having an effective amount of a passivating agent dissolved therein.

10. The method of claim 9 wherein said passivating agent is a member of the group consisting of chromates, hydroquinone, resorcinol, benzotriazole, sodium tolyltriazole, coco imidazole, 2-ethylhexyl mercaptoacetate, 2-mercaptobenzothiazole and sodium, potassium, lithium and ammonium salts thereof.

11. The method of claim 9 further comprising the step of bonding the passivated and reduced copper surface to the corresponding surface of a resin.

12. The method of claim 11 wherein said bonding is accomplished by applying heat and pressure.

13. A method for treating the oxidized surface of a copper film comprising;
contacting the oxidized surface of a copper film having black oxide whiskers protruding therefrom, with an acidic reducing solution having a pH of 1 to 6.5 and having an effective amount of a water soluble thiosulfate reducing agent dissolved therein to provide a reduced copper surface;
rinsing the reduced copper surface with an acidic solution to produce a rinsed and reduced copper surface having reduced whiskers protruding therefrom, said reduced whiskers each being a mix of cuprous oxide and metallic copper; and
passivating said acid rinsed and reduced copper surface with an aqueous solution containing an effective amount of a water soluble passivating agent dissolved therein;
whereby said passivated copper surface is suitable for bonding to the corresponding surface of a resin.

14. The method of claim 13 wherein said water soluble thiosulfate salt is a member of the group consisting of sodium thiosulfate, potassium thiosulfate and lithium thiosulfate.

15. The method of claim 14 wherein the concentration of said water soluble thiosulfate salt in said acidic reducing solution is 1–100 g/l.

16. The method of claim 15 wherein the concentration of said water soluble thiosulfate salt in said acidic reducing solution is 5–25 g/l.

17. The method of claim 16 wherein said water soluble thiosulfate salt is sodium thiosulfate.

18. The method of claim 17 wherein said pH is 3 to 5.5.

19. The method of claim 18 wherein said passivating agent is a member of the group consisting of chromates, hydroquinone, resorcinol, benzotriazole, sodium tolyltriazole, coco imidazole, 2-ethylhexyl mercaptoacetate, 2-mercaptobenzothiazole and sodium, potassium, lithium and ammonium salts thereof.

20. The method of claim 19 wherein said passivating agent is 2-mercaptobenzothiazole or a sodium, potassium lithium or ammonium salt thereof.

21. A layered product comprising at least one copper layer bonded to at least one resinous dielectric layer, wherein said copper layer has at least one whiskered surface that is bonded to a surface of said resinous dielectric layer, said one whiskered surface incorporating the metallic copper reaction product of a transient copper oxide layer and an acidic sodium thiosulfate solution.

22. The layered product of claim 21 wherein the pH of said acidic solution is from 3 to 5.5.

23. The layered product of claim 21 wherein two copper layers are each bound to a separate and opposing surface on said one resinous dielectric layer.

24. The layered product of claim 23 having a plurality of through holes joining each copper layer.

* * * * *

UNITED STATES PATENT AND TRADEMARK OFFICE
CERTIFICATE OF CORRECTION

PATENT NO. : 5,492,595
DATED : February 20, 1996
INVENTORS : Carano et al.

It is certified that error appears in the above-identified patent and that said Letters Patent is hereby corrected as shown below:

Column 7, line 3, "Angstroms (A)." should be --Angstroms (Å).--.

Column 7, line 31, "the dam in" should be --the data in--.

Column 10, line 49, "Add Rinse Of" should be --Acid Rinse Of--.

Column 15, line 65, "about minutes." should be --about 6 minutes.--.

Signed and Sealed this

Fifteenth Day of October, 1996

Attest:

BRUCE LEHMAN

*Attesting Officer*       *Commissioner of Patents and Trademarks*